US012210036B2

(12) United States Patent
Ursu et al.

(10) Patent No.: US 12,210,036 B2
(45) Date of Patent: Jan. 28, 2025

(54) TEST SOCKET FOR SEMICONDUCTOR INTEGRATED CIRCUITS

(71) Applicant: Smiths Interconnect Americas, Inc., Kansas City, MO (US)

(72) Inventors: Peter Ursu, San Ramon, CA (US); Jiachun Zhou, Grapevine, TX (US); Siang Soh, Milpitas, CA (US); Justin Bahaj, Kansas City, MO (US)

(73) Assignee: Smiths Interconnect Americas, Inc., Kansas City, MO (US)

( * ) Notice: Subject to any disclaimer, the term of this patent is extended or adjusted under 35 U.S.C. 154(b) by 10 days.

(21) Appl. No.: 17/995,831

(22) PCT Filed: Apr. 6, 2021

(86) PCT No.: PCT/US2021/025913
§ 371 (c)(1),
(2) Date: Oct. 7, 2022

(87) PCT Pub. No.: WO2021/207153
PCT Pub. Date: Oct. 14, 2021

(65) Prior Publication Data
US 2023/0143660 A1     May 11, 2023

Related U.S. Application Data (60) Provisional application No. 63/006,529, filed on Apr. 7, 2020.

(51) Int. Cl.
*G01R 1/04*     (2006.01)
*G01R 31/28*     (2006.01)
(Continued)

(52) U.S. Cl.
CPC ....... *G01R 1/0466* (2013.01); *G01R 31/2863* (2013.01); *H01R 13/20* (2013.01); *H01R 13/24* (2013.01); *H01R 2201/20* (2013.01)

(58) Field of Classification Search
CPC ........ G01R 1/04; G01R 1/0466; G01R 31/28; G01R 31/2863; G01R 1/067;
(Continued)

(56) References Cited

U.S. PATENT DOCUMENTS 7,059,866 B2    6/2006    Gilk
7,338,293 B2 *   3/2008    Gilk .................. H01R 13/2435
                                                                 439/66

(Continued)

FOREIGN PATENT DOCUMENTS

CN          201937121 U      8/2011
CN          102359758 A      2/2012
(Continued)

OTHER PUBLICATIONS

Chinese First Office Action, Application No. 202110372019.9 dated Dec. 26, 2023, 17 pps.: with English Translation.

*Primary Examiner* — Son T Le
(74) *Attorney, Agent, or Firm* — Armstrong Teasdale LLP (57) ABSTRACT

A test socket for an IC includes a socket body, a rotational contact, and an elastomer retainer. The socket body includes a top surface that faces the IC, and a bottom surface that faces a load board. The socket body defines a slot extending from the top surface to an aperture in the bottom surface. The rotational contact is positioned in the slot. The elastomer retainer captures the rotational contact in the socket body and includes a round section about which the rotational contact rotates. The elastomer retainer compresses under translatory force from the rotational contact when translating from the free state to the pre-load state upon engagement with the load board, and compresses under rotational force from the rotational contact when rotating from the pre-load state to the loaded state upon engagement with the IC.

18 Claims, 4 Drawing Sheets

(51) Int. Cl.
*H01R 13/20* (2006.01)
*H01R 13/24* (2006.01)

(58) Field of Classification Search
CPC .............. G01R 1/06738; G01R 1/0408; G01R 1/0416; G01R 31/2889; G01R 31/2896; H01R 13/20; H01R 13/24; H01R 2201/20
See application file for complete search history.

(56) References Cited

U.S. PATENT DOCUMENTS

| | | |
|---|---|---|
| 10,551,412 B2 | 2/2020 | Andres |
| 2005/0221675 A1 | 10/2005 | Rathburn et al. |
| 2009/0104795 A1 | 4/2009 | Osato et al. |
| 2009/0267629 A1* | 10/2009 | Foong ................. G01R 1/0483 |
| | | 324/756.02 |
| 2011/0312229 A1 | 12/2011 | Henry et al. |
| 2015/0372407 A1* | 12/2015 | Landa .................... H01R 12/85 |
| | | 439/376 |
| 2018/0120348 A1* | 5/2018 | Magnuson ........... G01R 1/0433 |
| 2020/0088763 A1 | 3/2020 | Zhou et al. |
| 2020/0256908 A1 | 8/2020 | Dongmei et al. |

FOREIGN PATENT DOCUMENTS

| | | |
|---|---|---|
| CN | 105390517 A | 3/2016 |
| CN | 105676114 A | 6/2016 |
| CN | 105807213 A | 7/2016 |
| CN | 108663546 A | 10/2018 |
| CN | 109103121 A | 12/2018 |
| TW | 201928356 A | 7/2019 |
| TW | M621299 U | 12/2021 |

\* cited by examiner

TEST SOCKET FOR SEMICONDUCTOR INTEGRATED CIRCUITS

CROSS-REFERENCE TO RELATED APPLICATIONS

This application is a U.S. National Phase Entry claiming priority to International Patent Application No. PCT/US2021/025913 filed on Apr. 6, 2021, titled Test Socket for Semiconductor Integrated Circuits, which claims priority to U.S. Provisional Patent Application No. 63/006,529, filed on Apr. 7, 2020, titled Test Socket for Semiconductor Integrated Circuits, the entire contents of which are hereby incorporated herein by reference.

FIELD OF INVENTION

The field of the disclosure relates generally to a test socket for semiconductor integrated circuits and, more specifically, a test socket with rotational contacts that translate, or "scrub," on the contact pads of the integrated circuit under test.

BACKGROUND

Semiconductor integrated circuits (ICs) are produced in various packages, or chip configurations, including, for example, a quad flat no-leads (QFN) package that is common in many IC applications and is produced in large quantities. Production of ICs of any quantity generally includes testing of the ICs in a manner that simulates an end-user's application of those ICs. One manner of testing ICs is to connect each IC to a printed circuit board (PCB) that exercises the contacts and various functionalities of the IC. That PCB is sometimes referred to as a load board, and can be re-used to test many ICs. A fundamental component of the load board that enables such testing is a test socket for the IC that can be re-used many times to test large quantities of the IC. The test socket connects, both electrically and mechanically, the IC to the load board. The degree to which the test socket can be re-used is quantified by how many "cycles" it can withstand without degrading performance, e.g., signal performance. Each time an IC is inserted, or set, into the test socket is referred to as one cycle. Generally, over the course of many cycles, electrical and mechanical properties of the contacts and structures of the test socket begin to degrade as a result of, for example, oxidation, abrasion, compression, tension, or other forms of wear. Such degradation eventually impacts integrity of the testing itself, at which point the test socket reaches the end of its useful life. Accordingly, test sockets that maintain good electrical and mechanical performance for long life cycles are desired.

BRIEF DESCRIPTION

In one aspect, a test socket for a flat no-leads semiconductor IC includes a socket body, a rotational contact, and an elastomer retainer. The socket body includes a top surface configured to face the flat no-leads semiconductor IC, and a bottom surface, opposite the top surface, configured to face a load board. The socket body defines a slot extending from the top surface to an aperture in the bottom surface. The rotational contact is positioned in the slot. The rotational contact is configured to translate between a free state and a pre-load state, and to rotate about a rounded section of the elastomer retainer between the pre-load state and a loaded state. The elastomer retainer captures the rotational contact in the socket body. The elastomer retainer is configured to compress under translatory force from the rotational contact when translating from the free state to the pre-load state upon engagement with the load board, and compress under rotational force from the rotational contact when rotating from the pre-load state to the loaded state upon engagement with the flat no-leads semiconductor IC.

In another aspect, a test system includes a load board and a test socket. The test socket includes a top surface configured to face the semiconductor IC, and a bottom surface, mounted to the load board. The socket body defines a slot extending from the top surface to an aperture in the bottom surface. The rotational contact is positioned in the slot in a pre-load state. The rotational contact is configured to rotate about a round section of the elastomer retainer between the pre-load state and a loaded state. The elastomer retainer captures the rotational contact in the socket body. The elastomer retainer compresses between a socket frame and the rotational contact, and is configured to further compress under rotational force from the rotational contact when rotating from the pre-load state to the loaded state upon engagement with the semiconductor IC.

In yet another aspect, a method of assembling a test system for a semiconductor IC is provided. The method includes positioning a plurality of rotational contacts in corresponding slots of a socket body for a test socket. The method includes positioning an elastomer retainer over the rotational contacts. The method includes mounting a socket frame over the plurality of rotational contacts and the elastomer retainer.

DETAILED DESCRIPTION

Embodiments of the test socket described herein provide a rotational contact that, when engaged with a load board and an IC under test, produces scrub on a contact pad of the IC. The described test sockets are configured to receive a flat no-leads IC package, such as a QFN IC, where scrub on the contact pad of the IC is desirable to reduce contact electrical resistance of the electrical connection between the IC and the rotational contact of the test socket. Conversely, the test sockets described herein generally minimize translation, or scrub, by the rotational contact on the PCB contact of the load board.

Figure 1:
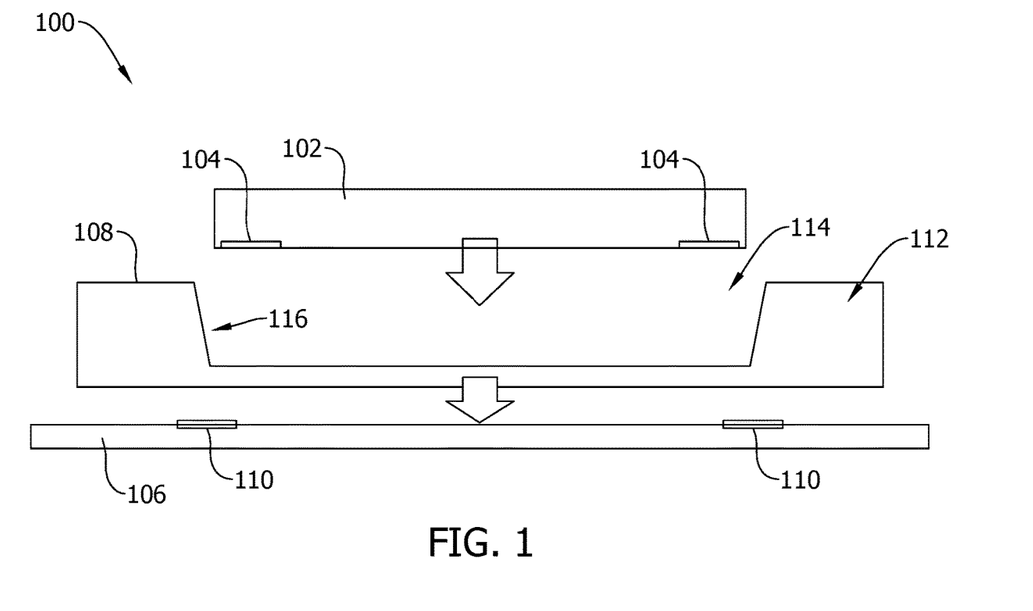
FIG. 1 is a cross-section diagram of an example IC test system.
Figure 2:
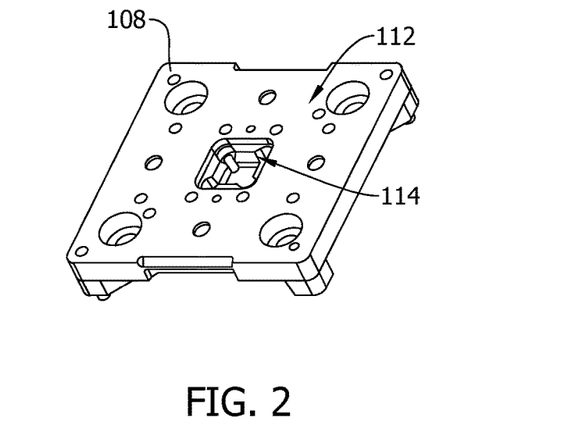
FIG. 2 is a perspective diagram of an example test socket for a QFN IC.

FIG. 1 is a cross-section diagram of an example IC test system 100 for testing a semiconductor IC 102. IC 102 is one or more electronic circuits packaged into a single semiconductor chip generally including a plurality of contact pads 104 for conducting signals to and from the circuits within the package. IC test system 100 includes a load board 106 onto which a test socket 108 is mounted. Load board 106 includes PCB contacts 110 that will connect IC 102 to a load circuit, or test circuit (not shown), integrated with load board 106. Test socket 108 is a re-usable interface for connecting many units of IC 102 to load board 106. FIG. 2 is a perspective diagram of test socket 108 for a QFN IC, such as IC 102. Test socket 108 includes a socket body 112 that defines a receptacle 114 that receives IC 102. In certain embodiments of test socket 108, socket body 112 includes guide walls 116 that may be straight or tapered for guiding IC 102 into receptacle 114 to ensure proper alignment of contact pads 104 with PCB contacts 110. More specifically, guide walls 116 align contact pads 104 with corresponding contacts (not shown) of test socket 108. The contacts of test socket 108 extend through socket body 112 to electrically connect each contact pad 104 of IC 102 with a corresponding PCB contact 110 on load board 106.

Figure 3:
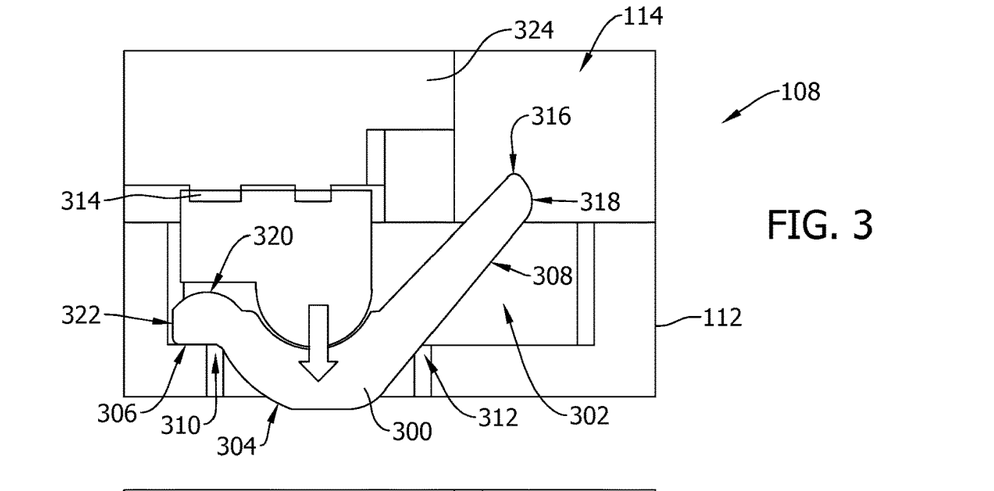
FIG. 3 is a cross-section diagram of one embodiment of a rotational contact in the test socket shown in FIG. 1 in a free state.
Figure 4:
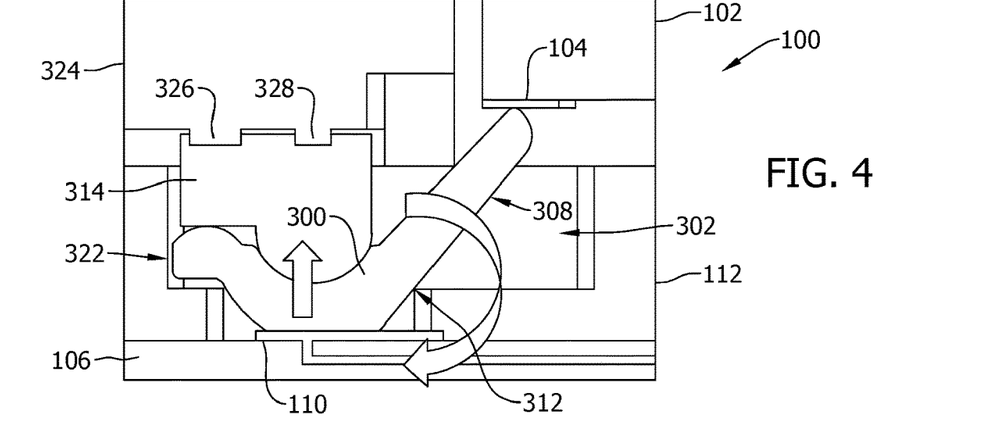
FIG. 4 is a cross-section diagram of the rotational contact shown in FIG. 3 in a pre-load state.
Figure 5:
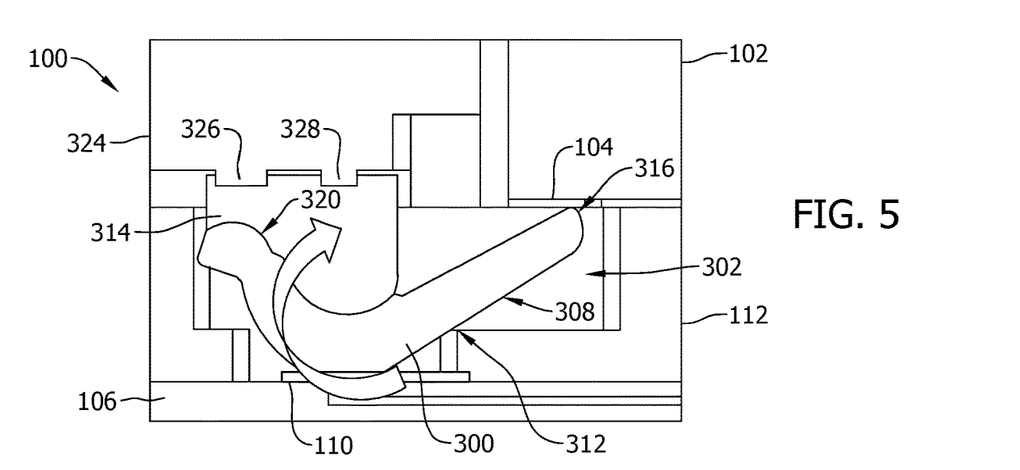
FIG. 5 is a cross-section diagram of the rotational contact shown in FIGS. 3 and 4 in a loaded state.
Figure 6:
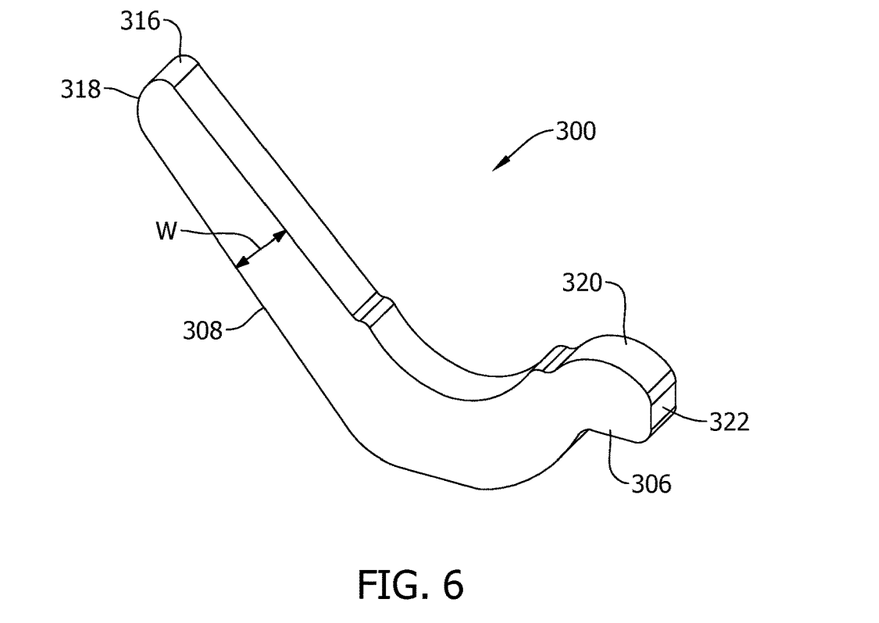
FIG. 6 is a perspective diagram of the rotational contact shown in FIGS. 3-6.

FIG. 3 is a cross-section diagram of one embodiment of a rotational contact 300 in test socket 108 (shown in FIG. 1) in a free state, i.e., before test socket 108 is mounted to load board 106, and before IC 102 is set. FIG. 4 is a cross-section diagram of rotational contact 300 in a pre-load state, i.e., test socket 108 is mounted to load board 106, but IC 102 is not yet set. FIG. 5 is a cross-section diagram of rotational contact 300 in a loaded state, i.e., test socket 108 is mounted to load board 106 and IC 102 is set into receptacle 114. FIG. 6 is a perspective diagram of rotational contact 300 separate from test socket 108. Rotational contact 300 is composed of an electrically conductive material, such as, for example, copper, copper alloy, aluminum, aluminum alloy, steel, or other conductive metal, or some combination thereof.

Rotational contact 300 is positioned in a slot 302 in socket body 112. Rotational contact 300 extends from receptacle 114 to an aperture 304 in socket body 112 where it protrudes and engages PCB contact 110. Rotational contact 300 includes a surface 306 and an arm 308 that rest respectively on a surface 310 and a support edge 312 of socket body 112 when rotational contact 300 is in the free state. Rotational contact 300 is captured in slot 302 by an elastomer retainer 314 that holds, or biases, rotational contact 300 against surface 310 and support edge 312. Elastomer retainer 314 provides force to maintain good connections between rotational contact 300 and contact pads 104 of IC 102, and between rotational contact 300 and PCB contact 110 of load board 106.

Rotational contact 300 terminates at a first end with a tip 316 that engages and translates, or scrubs, on contact pad 104 of IC 102, and includes a rounded edge 318 connecting tip 316 to a lower surface of arm 308. Rotational contact 300 terminates at a second end, opposite tip 316, with a round nail 320 and a flat 322.

Tip 316 of rotational contact 300 should be pointed, or "sharp," to enable effective scrubbing on contact pad 104 of IC 102. For example, in one embodiment, tip 316 is rounded with a radius of about 0.05 millimeters (mm). More generally, tip 316 should be rounded with a radius of no more than 0.10 mm.

Rounded edge 318 connecting tip 316 to the lower surface of arm 308 of rotational contact 300 is rounded with a sufficient radius to enable smooth motion during assembly of test socket 108 in the free state, and to enable smooth rotational motion within slot 302. For example, in one embodiment, rounded edge 318 has a radius of about 0.15 mm.

Arm 308 of rotational contact is substantially straight and, in certain embodiments, is narrower at tip 316 than at the opposite end of rotational contact 300. For example, arm 308 may taper, having a narrow width, W, near tip 316, to a wider width, W, near the point of contact with PCB contact 110. The taper of arm 308 enables greater mechanical strength of rotational contact 300 due to the increased width, W. The taper of arm 308 also enables efficient current conduction by avoiding discontinuities in the surfaces of rotational contact 300. The width, W, of arm 308 also partially defines (with the shape of surface 306) where rotational contact 300 rests on socket body 112 at surface 310 and support edge 312.

Surface 306 of rotational contact 300 rests on surface 310 of socket body 112 when test socket 108 is in the free state, and rises away from surface 310 when in the pre-load or loaded state. Round nail 320 engages elastomer retainer 314 when rotational contact moves into the pre-load state. Round nail 320 is rounded to provide smooth deformation of elastomer retainer 314 and reduces wear on elastomer retainer 314 when deforming. In one embodiment, for example, round nail 320 has a radius of about 0.18 mm. More generally, round nail 320 should have a radius of at least 0.10 mm to enable smooth deformation and to minimize wear on elastomer retainer 314.

When test socket 108 is mounted on load board 106 (i.e., the pre-load state shown in FIG. 4), PCB contact 110 engages rotational contact 300, and load board 106 engages socket body 112. Upon engaging rotational contact 300, PCB contact 110 forces rotational contact 300 upward to compress elastomer retainer 314 against a socket frame 324 of test socket 108. More specifically, rotational contact 300 translates toward socket frame 324, compressing and deforming elastomer retainer 314 against a first head 326 and a second head 328 of socket frame 324. Flat 322 of rotational contact 300 enables smooth translation of rotational contact 300 along a wall of socket body 112 that partially defines slot 302. Elastomer retainer 314, upon engagement with load board 106 and compression of elastomer retainer 314, applies a pre-load force to rotational contact 300. The pre-load force applied to rotational contact 300 ensures good electrical contact between rotational contact 300 and PCB contact 110, and must be at least partially overcome by insertion of IC 102 into receptacle 114. The amount of pre-load force provided by elastomer retainer 314 is customizable for a given application by selecting appropriate properties of elastomer retainer 314.

When IC 102 is inserted, or set, into receptacle 114 of test socket 108, contact pad 104 engages tip 316 of rotational contact 300, forcing tip 316 downward into slot 302 in socket body 112. Downward motion of tip 316 into slot 302 results in rotational motion of rotational contact 300 about elastomer retainer 314. Support edge 312 of socket body 112 also functions as a fulcrum, or pivot point, transferring downward force of IC 102 into a compressing force, or a contact force, applied by round nail 320 of rotational contact 300 onto elastomer retainer 314, which further deforms against first head 326 and second head 328 of socket frame 324. Likewise, PCB contact 110 also operates as a pivot point to transfer downward force of IC 102 to a rotational force to compress elastomer retainer 314. Because motion of rotational contact 300 is rotational, round nail 320 rotates away from the wall of socket body 112 and, likewise, tip 316 of rotational contact 300 translates, or scrubs, along contact pad 104. The scrub produced by rotational motion of rotational contact 300 and, more specifically, tip 316 reduces electrical resistance of the connection between contact pad 104 and rotational contact 300, and ultimately reducing the contact electrical resistance of the electrical connection between contact pad 104 of IC 102 and PCB contact 110 of load board 106. Rotation about elastomer retainer 314 and across PCB contact 110 enables reduction of scrub on PCB pad 110 of load board 106.

When IC 102 is removed from receptacle 114 of test socket 108, elastomer retainer 314, previously deformed under rotational force, returns to the pre-load state and reverses the rotational force on rotational contact 300, and returns rotational contact 300 to the pre-load state with a return force.

Figure 7:
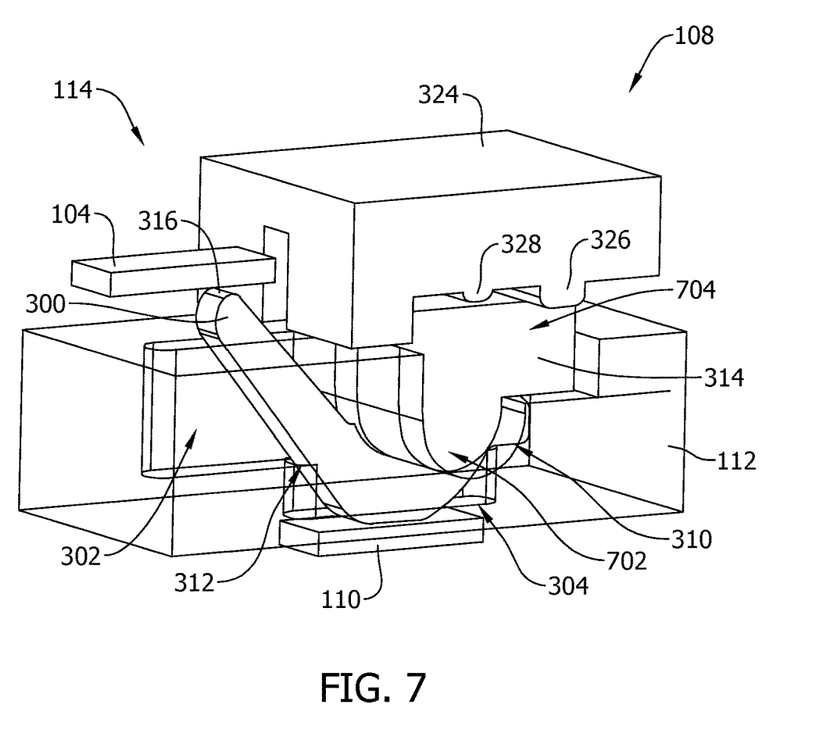
FIG. 7 is a perspective diagram of the rotational contact shown in FIGS. 3-5 in the free state.

FIG. 7 is a perspective diagram of rotational contact 300 (shown in FIGS. 3-6) positioned in test socket 108 in the free state. FIG. 7 illustrates contact pad 104 separate from IC 102, and illustrates PCB contact 110 separate from load board 106. Rotational contact 300 is positioned in slot 302 defined in socket body 112. FIG. 7 illustrates only the portion of socket body 112 proximate the shown rotational contact 300. Embodiments of test socket 108 may include any number of rotational contacts 300 packaged in respective slots 302 along one or more dimensions. For example, one embodiment of test socket 108, shown in FIG. 2, is configured for a QFN IC having a plurality of rotational contacts 300 arranged on all four sides of socket body 112. In such an embodiment, for example, slots 302 are independently defined in socket body 112 to constrain motion of rotational contacts 300 to rotational motion in the plane shown in FIGS. 3-5. Conversely, in certain embodiments, elastomer retainer 314 and socket frame 324 span multiple rotational contacts 300 positioned in their respective slots 302.

Figure 8:
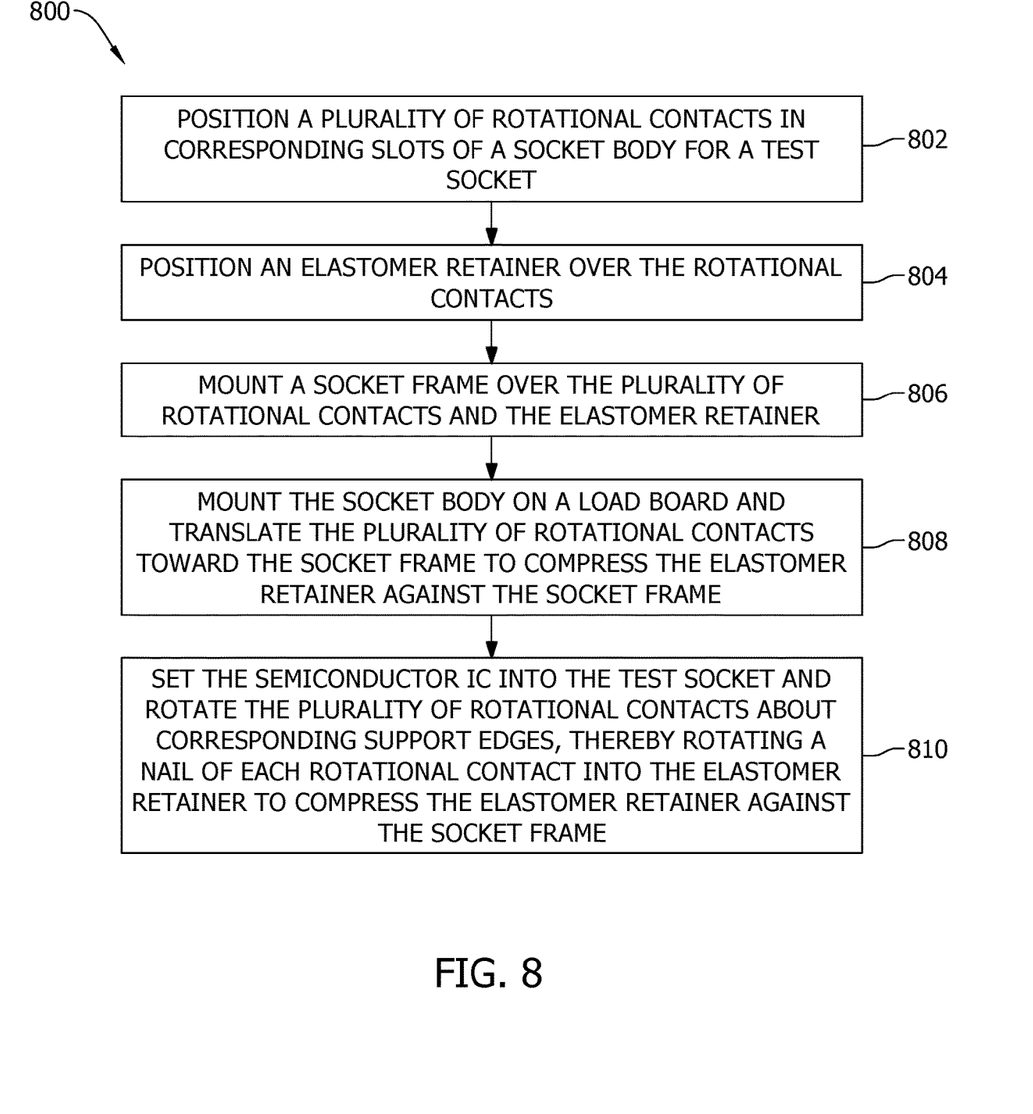
FIG. 8 is a flow diagram of a method of assembling a test system for a semiconductor IC.

Elastomer retainer 314 provides force to maintain good, or "tight," connections between rotational contact 300 and contact pads 104 of IC 102, and between rotational contact 300 and PCB contact 110 of load board 106. Elastomer retainer 314 includes a round section 702 that engages rotational contact 300 to produce the pre-load force. Elastomer retainer 314 includes a quadrangle section 704 that deforms when rotational contact 300 transitions to the loaded state, under a contact force from IC 102, and pushes rotational contact 300, with a return force, back to the pre-load state when IC 102 is removed from receptacle 114 of test socket 108. First head 326 of socket frame 324 is positioned to align with an apex, or tip, of nail 320. Likewise, second head 328 of socket frame 324 is positioned to align with a centerline of round section 702 of elastomer retainer FIG. 8 is a flow diagram for a method 800 of assembling test socket 108 shown in FIGS. 3-5 and 7. Rotational contacts 300 are positioned 802 in corresponding slots 302 of a socket body 112. Each rotational contact 300 is positioned on a surface 310 and a support edge 312. Elastomer retainer 314 is then positioned 804 over rotational contacts 300 to capture rotational contacts 300 between elastomer retainer 314 and socket body 112. Socket frame 324 is mounted 806 over rotational contacts 300 and elastomer retainer 314, which holds both elastomer retainer 314 and rotational contacts 300 in place. Elastomer retainer 314 is uncompressed when rotational contacts 300 are in the free state, i.e., before test socket 108 is mounted onto a load board. Test socket 108 is then mounted 808 onto load board 106 to transition rotational contacts 300 from the free state to the pre-load state. Rotational contacts 300 translate toward socket frame 324 into the pre-load state, compressing elastomer retainer 314 against socket frame 324. More specifically, elastomer retainer 314 compresses and deforms against first head 326 and second head 328 of socket frame 324.

Semiconductor IC 102 is set 810 into test socket 108 to transition rotational contacts 300 from the pre-load state to the loaded state. Rotational contacts 300 rotate about elastomer retainer 314, rotating nail 320 of each rotational contact 300 into elastomer retainer 314 to compress elastomer retainer 314 against socket frame 324. Tip 316 of each rotational contact 300 translates across a corresponding contact pad 104 of semiconductor IC 102.

When semiconductor IC 102 is removed from test socket 108, rotational contacts 300 rotate back to the pre-load state. When transitioning from the loaded state back to the pre-load state, elastomer retainer 314 releases and rotates nail 320 back toward surface 310 of socket body 112, thereby rotating tip 316 back toward socket frame 324.

The technical effects of the systems and apparatuses described herein may include: (a) providing customizable pre-load force via an elastomer retainer; (b) enabling scrub across semiconductor IC contact pads when setting the IC into the test socket; (c) reducing contact electrical resistance between test socket and IC by introducing scrub when setting the IC in the test socket; and (d) reducing scrub across the PCB contact of the load board by the rotational contact.

In the foregoing specification and the claims that follow, a number of terms are referenced that have the following meanings.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here, and throughout the specification and claims, range limitations may be combined or interchanged. Such ranges are identified and include all the sub-ranges contained therein unless context or language indicates otherwise.

Disjunctive language such as the phrase "at least one of X, Y, or Z," unless specifically stated otherwise, is generally understood within the context as used to state that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A test socket for a flat no-leads semiconductor integrated circuit (IC), comprising:
    a socket body including a top surface configured to face the flat no-leads semiconductor IC, and a bottom surface, opposite the top surface, configured to face a load board, the socket body defining a slot extending from the top surface to an aperture in the bottom surface;
    a rotational contact positioned in the slot, the rotational contact configured to translate between a free state and a pre-load state, and to rotate between the pre-load state and a loaded state;
    an elastomer retainer capturing the rotational contact in the socket body, the elastomer retainer including a rounded section about which the rotational contact rotates, the elastomer retainer configured to compress under translatory force from the rotational contact when translating from the free state to the pre-load state upon engagement with the load board, and compress under rotational force from the rotational contact when rotating from the pre-load state to the loaded state upon engagement with the flat no-leads semiconductor IC; and
    a socket frame defining a receptacle into which the flat no-leads semiconductor IC is configured to be set, wherein the socket frame is disposed over the elastomer retainer, and wherein the elastomer retainer is configured to compress under translatory force from the rotational contact against a first head and a second head protruding from the socket frame towards the load board.

2. The test socket of claim 1, wherein the rotational contact comprises a tip proximate the top surface of the socket body, the tip configured to engage a contact pad of the flat no-leads semiconductor IC when the rotational contact rotates from the pre-load state to the loaded state.

3. The test socket of claim 2, wherein the tip of the rotational contact is configured to translate across the contact pad of the flat no-leads semiconductor IC when the rotational contact rotates from the pre-load state to the loaded state.

4. The test socket of claim 2, wherein the rotational contact further comprises a nail at an end opposite the tip, the nail configured to travel away from a wall of the socket body when the rotational contact rotates from the pre-load state to the loaded state.

5. The test socket of claim 2, wherein the rotational contact further comprises:
    a lobe proximate the bottom surface of the socket body and configured to engage a printed circuit board (PCB) pad of the load board when in the pre-load state and the loaded state; and
    an arm extending between the tip and the lobe, the arm configured to pivot on a support edge of the socket body within the slot.

6. The test socket of claim 1, wherein the elastomer retainer is configured to compress under rotational force from the rotational contact against the socket frame.

7. A test system for a semiconductor integrated circuit (IC), the test system comprising:
    a load board; and
    a test socket, comprising:
        a socket body including a top surface configured to face the semiconductor IC, and a bottom surface, mounted to the load board, the socket body defining a slot extending from the top surface to an aperture in the bottom surface;
        a rotational contact positioned in the slot in a pre-load state, the rotational contact configured to rotate between the pre-load state and a loaded state;
        an elastomer retainer capturing the rotational contact in the socket body, the elastomer retainer including a round section about which the rotational contact is configured to rotate, and a quadrangle section that provides a contact force and a return force to the rotational contact, the elastomer retainer compressed between a socket frame and the rotational contact, and configured to further compress under rotational force from the rotational contact when rotating from the pre-load state to the loaded state upon engagement with the semiconductor IC; and
        a socket frame defining a receptacle into which the semiconductor IC is configured to be set, wherein the socket frame is disposed over the elastomer retainer, and wherein the elastomer retainer is configured to compress under translatory force from the rotational contact against a first head and a second head protruding from the socket frame towards the load board.

8. The test system of claim 7, wherein the rotational contact comprises a tip proximate the top surface of the socket body, the tip configured to engage a contact pad of the semiconductor IC when the rotational contact rotates from the pre-load state to the loaded state.

9. The test system of claim 8, wherein the tip of the rotational contact is configured to translate across the contact pad of the semiconductor IC when the rotational contact rotates from the pre-load state to the loaded state.

10. The test system of claim 8, wherein the rotational contact further comprises a nail at an end opposite the tip, the nail configured to travel away from a wall of the socket body when the rotational contact rotates from the pre-load state to the loaded state.

11. The test system of claim 8, wherein the rotational contact further comprises:
    a lobe proximate the bottom surface of the socket body and configured to engage a printed circuit board (PCB) pad of the load board when in the pre-load state and the loaded state; and an arm extending between the tip and the lobe, the arm configured to pivot on the support edge of the socket body within the slot.

12. The test system of claim 7, wherein the socket frame includes a tapered guide wall configured to align a contact pad of the semiconductor IC with the rotational contact.

13. A method of assembling a test system for a semiconductor integrated circuit (IC), the method comprising:
positioning a plurality of rotational contacts in corresponding slots of a socket body for a test socket;
positioning an elastomer retainer over the rotational contacts; and
mounting a socket frame over the plurality of rotational contacts and the elastomer retainer, wherein the socket frame defines a receptacle into which the semiconductor IC is configured to be set, and wherein the elastomer retainer is configured to compress under translatory force from at least one of the plurality of the rotational contacts against a first head and a second head protruding from the socket frame towards a load board.

14. The method of claim 13, wherein positioning the plurality of rotational contacts comprises, for each rotational contact of the plurality of rotational contacts, positioning the rotational contact on a support edge of the socket body.

15. The method of claim 13 further comprising:
mounting the socket body on the load board; and
translating the plurality of rotational contacts toward the socket frame into a pre-load state to compress the elastomer retainer against the socket frame.

16. The method of claim 15 further comprising:
setting the semiconductor IC into the test socket; and
rotating the plurality of rotational contacts about the elastomer retainer into a loaded state, thereby rotating a nail of each rotational contact into the elastomer retainer to compress the elastomer retainer against the socket frame.

17. The method of claim 16, wherein rotating the plurality of rotational contacts comprises translating a tip of each rotational contact across a corresponding contact pad of the semiconductor IC.

18. The method of claim 16 further comprising removing the semiconductor IC from the test socket and rotating the plurality of rotational contacts back to the pre-load state.

* * * * *